(12) United States Patent
Sekine et al.

(10) Patent No.: US 9,793,236 B2
(45) Date of Patent: Oct. 17, 2017

(54) WIRE-BONDING APPARATUS AND METHOD OF MANUFACTURING SEMICONDUCTOR DEVICE

(71) Applicant: SHINKAWA LTD., Tokyo (JP)

(72) Inventors: Naoki Sekine, Tokyo (JP); Motoki Nakazawa, Tokyo (JP); Yasuo Nagashima, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 14/712,932

(22) Filed: May 15, 2015

(65) Prior Publication Data

US 2015/0249063 A1 Sep. 3, 2015

Related U.S. Application Data

(63) Continuation of application No. PCT/JP2013/075103, filed on Sep. 18, 2013.

(30) Foreign Application Priority Data

Nov. 16, 2012 (JP) .................................. 2012-252253

(51) Int. Cl.
*B23K 31/02* (2006.01)
*H01L 23/00* (2006.01)
(Continued)

(52) U.S. Cl.
CPC ............ *H01L 24/78* (2013.01); *B23K 20/005* (2013.01); *B23K 20/10* (2013.01); *H01L 24/85* (2013.01);
(Continued)

(58) Field of Classification Search
CPC . H01L 2224/48227; H01L 2224/48247; H01L 2224/48471; H01L 2224/48095;
(Continued)

(56) References Cited

U.S. PATENT DOCUMENTS 4,422,568 A 12/1983 Elles et al.
4,437,604 A * 3/1984 Razon .................. B23K 20/005
228/180.5

(Continued)

FOREIGN PATENT DOCUMENTS

JP 55-7415 1/1980
JP 58-9332 1/1983
(Continued)

*Primary Examiner* — Erin Saad
(74) *Attorney, Agent, or Firm* — Jianq Chyun IP Office

(57) ABSTRACT

Provided is a wire-bonding apparatus (10) including: a capillary (28) through which a wire (30) inserted; and a controller (80). The controller (80) is configured to execute operations including: a disconnection operation, after the second bonding operation, of moving the capillary through which the wire is inserted within a horizontal plane vertical to an axial direction of the capillary while the wire is held in the clamped state, and thereby disconnecting the wire from the second bonding point; a preliminary bonding operation of feeding the wire from the second bonding point to a predetermined preliminary bonding point, and performing preliminary bonding at the preliminary bonding point; and a shaping operation, after the preliminary bonding operation, of shaping the wire projecting from a tip of the capillary into a predetermined flexed shape.

4 Claims, 7 Drawing Sheets

(51) Int. Cl.
*B23K 20/00* (2006.01)
*B23K 20/10* (2006.01)

(52) U.S. Cl.
CPC .............. *H01L 24/45* (2013.01); *H01L 24/48* (2013.01); *H01L 2224/05554* (2013.01); *H01L 2224/45015* (2013.01); *H01L 2224/45124* (2013.01); *H01L 2224/45144* (2013.01); *H01L 2224/48091* (2013.01); *H01L 2224/48227* (2013.01); *H01L 2224/48247* (2013.01); *H01L 2224/48472* (2013.01); *H01L 2224/78301* (2013.01); *H01L 2224/78313* (2013.01); *H01L 2224/78343* (2013.01); *H01L 2224/78901* (2013.01); *H01L 2224/85186* (2013.01); *H01L 2224/85201* (2013.01); *H01L 2224/85205* (2013.01)

(58) Field of Classification Search
CPC . H01L 2224/78301; H01L 2224/45015; H01L 2224/85051; H01L 2224/85986; H01L 2224/78621; B23K 20/007; B23K 20/004; B23K 20/005

USPC ...................................................... 228/180.5
See application file for complete search history.

(56) References Cited

U.S. PATENT DOCUMENTS

| | | | |
|---|---|---|---|
| 6,477,768 B1 * | 11/2002 | Wildner | B23K 20/004 228/180.5 |
| 2005/0167473 A1 | 8/2005 | Mayer et al. | |
| 2009/0194577 A1 * | 8/2009 | Mii | B23K 20/004 228/160 |

FOREIGN PATENT DOCUMENTS

| | | |
|---|---|---|
| JP | 58-089833 | 5/1983 |
| JP | 60-182147 | 9/1985 |
| JP | 2000-306940 | 11/2000 |
| JP | 3335043 | 10/2002 |

* cited by examiner

WIRE-BONDING APPARATUS AND METHOD OF MANUFACTURING SEMICONDUCTOR DEVICE

CROSS REFERENCE TO RELATED APPLICATIONS

This application is a Continuation of PCT International Application No. PCT/JP2013/075103, filed on Sep. 18, 2013, which claims priority under 35 U.S.C §119(a) to Patent Application No. 2012-252253, filed in Japan on Nov. 16, 2012, all of which are hereby expressly incorporated by reference into the present application.

TECHNICAL FIELD

The present invention relates to an apparatus and a method capable of performing wire bonding using a capillary.

BACKGROUND ART

A wire-bonding apparatus is used for connecting between a lead of a substrate and a pad of a chip with a fine wire, for example. The wire bonding is performed in the following manner. Specifically, a wire along with a tool for wire bonding is caused to move down toward a lead. The wire and the tool are first moved down at high speed, and then slowed down when they come closer to the lead. The low-speed lowering at this time is referred to as first searching (1'st searching). Then, the wire is pressed against the lead by a tip of the tool, and the wire and the lead are bonded while ultrasonic vibration is applied. This bonding is referred to as first bonding (1'st bonding). After the first bonding, the tool is moved upward to feed the wire and moved above a pad while forming an appropriate loop. When the tool comes above the pad, the tool is moved down. The wire is first moved down at high speed, and then slowed down when it comes closer to the pad. The low-speed lowering at this time is referred to as second searching (2'nd searching). Then, the wire is pressed against the pad by the tip of the tool, and second bonding (2'nd bonding) is performed by bonding the wire and the pad while ultrasonic vibration is applied. After the second bonding, the tool is moved upward while the movement of the wire is stopped by a wire clamper to cause the wire to be disconnected at the second bonding point. Repeating this, a plurality of leads of a substrate and of a plurality of pads of a chip are connected. Here, heating may be performed appropriately during the first bonding and the second bonding. Moreover, the first bonding may be performed to the bonding pads, and the second bonding may be performed to the leads.

As described above, in the wire bonding, two bonding including the first bonding and the second bonding are performed. Unfortunately, however, there is a case in which the first bonding or the second bonding is not normally performed. Further, there may be a case in which, as the first bonding is insufficient, the wire is separated from the lead at the stage of the loop formation before the second bonding. There may also be a case in which the wire is disconnected in the middle of the loop formation even if the first bonding has been normally performed. These phenomena are collectively referred to as nonsticking, and detection of such nonsticking is required to be performed at an early stage. In order to detect nonsticking, a voltage or a current is applied between a side of the substrate and a side of the wire of the tool, and nonsticking is determined based on whether or not a resistance component, a diode component, and a capacitance component between these sides are normal.

Known methods of wire bonding include a ball bonding method and a wedge bonding method.

In the ball bonding method, a gold wire or the like with which a FAB (Free Air Ball) may be formed by high-voltage spark or the like is used, and a capillary having a chamfer portion rotationally symmetric about an axis along a longitudinal direction at its tip is used as a tool.

In the wedge bonding method, an aluminum wire or the like is used and any FAB is formed, and a tool for wedge bonding having a wire feed guide and a pressing surface at its tip is used as a tool for bonding instead of a capillary. In the wedge bonding, at the tip of the tool, the wire is fed along the wire feed guide at an angle on a side of the pressing surface, and a side surface of the wire is pressed against a bonding target with the pressing surface so as to perform bonding. Therefore, the wire projects laterally from the pressing surface by the tip of the tool, and the tip of the tool is not rotationally symmetric about the axis along a longitudinal direction.

As the tip of the tool for wedge bonding is not rotationally symmetric, there is a case in which a direction of the wire feed guide may not be aligned with a direction of connection of the wire as it is depending on the arrangement of the pads and the leads. Accordingly, a bonding head that holds the tool is configured as a rotary type, or a bonding stage that holds the bonding target is rotated. Thus, there is proposed a method of using a capillary having a rotationally symmetric tip, and of pressing the side of the wire with the tip of the capillary to perform bonding.

SUMMARY OF INVENTION

Technical Problems

By using a capillary whose tip is rotationally symmetric, it is possible to bond a wire regardless of a connecting direction of the wire, by pressing a side surface of the wire with the tip of the capillary. In this case, if the wire is disconnected along the connecting direction of the wire after bonding is performed at a second bonding point, a direction in which the side surface of the pressed wire extends is directed to the connecting direction of the wire in the previous wire bonding at a first bonding point in subsequent wire bonding. Therefore, when the wire is extended in a connecting direction toward a second bonding point in the subsequent wire bonding, an angle is made between the direction in which the side surface of the pressed wire extends and the connecting direction of the wire at the first bonding point. If the wire is extended with changing an angle at the first bonding point, a bonding strength at the first bonding point decreases. It is preferable that the direction in which the side surface of the pressed wire extends and the connecting direction of the wire match at the first bonding point.

One method of matching the direction in which the side surface of the pressed wire extends with the connecting direction of the wire at first bonding point in the subsequent wire bonding regardless of the connecting direction of the wire in the previous wire bonding is to disconnect the wire while moving the capillary in a vertical direction from the second bonding point after bonding at the second bonding point is completed. With this, a direction to which a tip of the disconnected wire extends becomes straight along an axial direction of the capillary, and is not related with the connecting direction of the wire. Therefore, the tip of the wire extending along the axial direction of the capillary can be flexed so as to match the connecting direction in the subsequent wire bonding. Unfortunately, however, if the wire is pulled up in the vertical direction from the second bonding point and disconnected, the wire often curls up, or even separated in some cases, from a bonding target at the second bonding point. In this manner, a bonding strength at the second bonding point decreases if the wire is disconnected in the vertical direction from the second bonding point.

An object of the present invention is to provide a wire-bonding apparatus capable of ensuring a bonding strength at a first bonding point and a bonding strength at a second bonding point, as well as a method of manufacturing a semiconductor device.

Solution to Problems

A wire-bonding apparatus according to the present invention includes: a capillary through which a wire is inserted; a damper configured to hold the wire in a clamped state with respect to the capillary; and a controller configured to control movement of the capillary and an operation of the damper, wherein the controller is configured to execute operations including: a first bonding operation of bonding the wire to a first bonding target at a first bonding point in wire bonding according to a wedge bonding method using the capillary through which the wire is inserted; a second bonding operation, after the first bonding operation, of feeding the wire from the first bonding point by a predetermined loop length, and bonding the wire to a second bonding target at a second bonding point in the wire bonding; a disconnection operation, after the second bonding operation, of moving the capillary through which the wire is inserted within a horizontal plane vertical to an axial direction of the capillary while the wire is held in the clamped state, and thereby disconnecting the wire from the second bonding point; a preliminary bonding operation of feeding the wire from the second bonding point to a predetermined preliminary bonding point, and performing preliminary bonding at the preliminary bonding point; and a shaping operation, after the preliminary bonding operation, of shaping the wire projecting from a tip of the capillary into a predetermined flexed shape.

It is preferable that the wire-bonding apparatus according to the present invention further includes: a folding station used for shaping the wire projecting from the tip of the capillary into a predetermined folded shape.

Further, it is preferable that the wire-bonding apparatus according to the present invention be configured such that the preliminary bonding operation further includes a disconnecting operation, after the preliminary bonding, of moving the capillary through which the wire is inserted in a direction parallel to the axial direction of the capillary while the wire is held in the clamped state, and thereby disconnecting the wire from the preliminary bonding point, and in the shaping operation, after the disconnecting operation in the preliminary bonding operation, the capillary in a state in which the wire is projected from the tip is moved to a previously determined position of a folding station, the tip of the capillary is pressed against an upper surface of the folding station, and to thereby shape the wire projecting from the tip of the capillary into the predetermined flexed shape.

Further, it is preferable that the wire-bonding apparatus according to the present invention be configured such that the preliminary bonding operation further includes a disconnecting operation, after the preliminary bonding, of moving the capillary through which the wire is inserted in a direction parallel to the axial direction of the capillary while the wire is held in the clamped state, and thereby disconnecting the wire from the preliminary bonding point, and in the shaping operation, after the disconnecting operation in the preliminary bonding operation, the capillary through which the wire is inserted is moved while the wire is held in the clamped state by a predetermined distance in a horizontal direction vertical to the axial direction of the capillary, the wire is disconnected from the preliminary bonding point, and to thereby shape the wire projecting from the tip of the capillary into the predetermined flexed shape.

Further, it is preferable that the wire-bonding apparatus according to the present invention be configured such that the wire bonding at the first bonding point and the second bonding point is performed according to a wedge bonding method.

Further, a method of manufacturing a semiconductor device according to the present invention includes: a first bonding step of bonding the wire to a first bonding target at a first bonding point in wire bonding according to a wedge bonding method using the capillary through which the wire is inserted; a second bonding step, after the first bonding step, of feeding the wire from the first bonding point by a predetermined loop length, and bonding the wire to a second bonding target at a second bonding point in the wire bonding; a disconnecting step, after the second bonding step, of moving the capillary through which the wire is inserted within a horizontal plane vertical to an axial direction of the capillary while the wire is held in the clamped state, and thereby disconnecting the wire from the second bonding point; a preliminary bonding step, after the disconnecting step, of feeding the wire from the second bonding point to a predetermined preliminary bonding point, and performing preliminary bonding at the preliminary bonding point, then moving the capillary through which the wire is inserted in a direction parallel to the axial direction of the capillary while the wire is held in the clamped state, and thereby disconnecting the wire from the preliminary bonding point; and a shaping step, after the preliminary bonding step, of moving the capillary in a state in which the wire is projected from the tip to a previously determined position of a folding station, pressing the tip of the capillary against an upper surface of the folding station, and thereby shaping the wire projecting from the tip of the capillary into the predetermined flexed shape.

Further, a method of manufacturing a semiconductor device according to the present invention includes: a first bonding step of bonding the wire to a first bonding target at a first bonding point in wire bonding according to a wedge bonding method using the capillary through which the wire is inserted; a second bonding step, after the first bonding step, of feeding the wire from the first bonding point by a predetermined loop length, and bonding the wire to a second bonding target at a second bonding point in the wire bonding; a disconnecting step, after the second bonding step, of moving the capillary through which the wire is inserted within a horizontal plane vertical to an axial direction of the capillary while the wire is held in the clamped state, and thereby disconnecting the wire from the second bonding point; a preliminary bonding step, after the disconnecting step, of feeding the wire from the second bonding point to a predetermined preliminary bonding point, and performing preliminary bonding at the preliminary bonding point, then moving the capillary through which the wire is inserted in a direction parallel to the axial direction of the capillary while the wire is held in the clamped state, and thereby disconnecting the wire from the preliminary bonding point; and a shaping step, after the preliminary bonding step, of moving the capillary through which the wire is inserted while the wire is held in the clamped state by a predetermined distance in a horizontal direction vertical to the axial direction of the capillary, disconnecting the wire from the preliminary bonding point, and thereby shaping the wire projecting from the tip of the capillary into the predetermined flexed shape.

Advantageous Effects of Invention

According to a wire-bonding apparatus and a method of manufacturing a semiconductor device of the present invention, it is possible to ensure a bonding strength at a first bonding point and a bonding strength at a second bonding point.

DESCRIPTION OF EMBODIMENT

Figure 1:
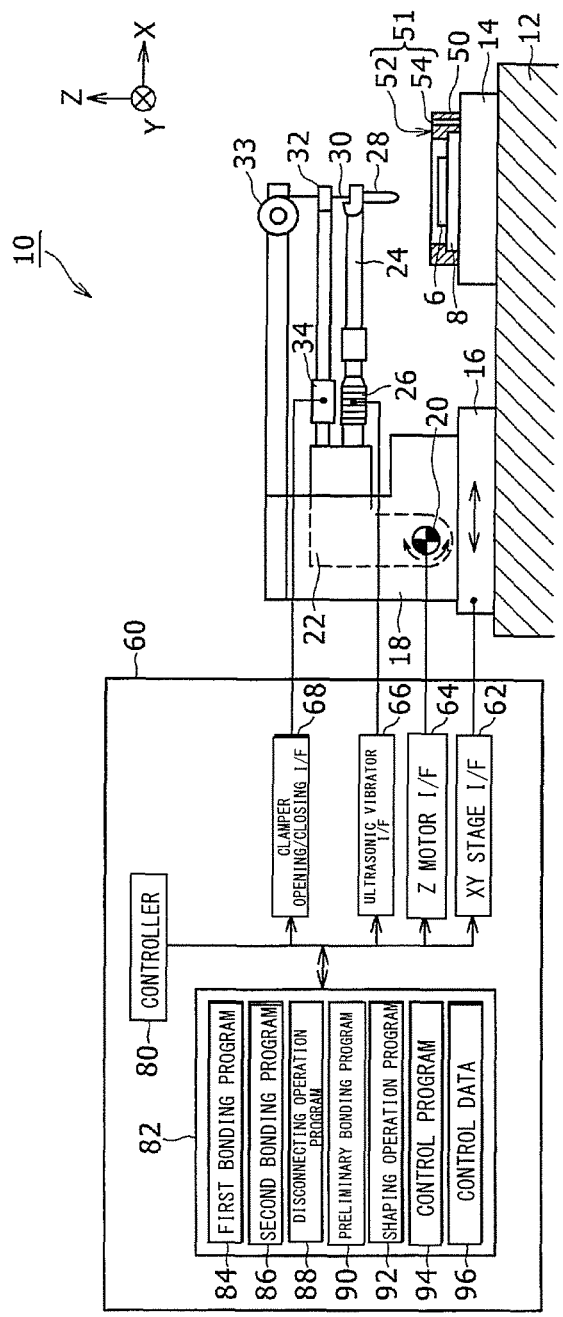
FIG. 1 is a configuration diagram of a wire-bonding apparatus according to an embodiment of the present invention.

Hereinafter, an embodiment according to the present invention will be described with reference to the drawings. In the following description, as target objects of wire bonding, a lead of a circuit board is taken as a first bonding point, and a pad of a chip is taken as a second bonding point. However, this is exemplification for explanation, and the first bonding point can be a pad of the chip, and the second bonding point can be a lead of the circuit board. Both of the first bonding point and the second bonding point can be pads of the chip, or both of the first bonding point and the second bonding point can be leads of the circuit board. The pads and the leads are examples of a target object to which the wire is bonded, and the target object can take a different form. Further, examples of the target object of bonding include, in addition to the chip, a general electronic component such as a resistor chip or a capacitor chip, and the circuit board can be an epoxy resin substrate or the like, or a lead frame or the like.

Dimensions and materials described below are exemplification for explanation, and can be altered appropriately according to specification of a wire-bonding apparatus.

In the following description, a single component and its corresponding components are denoted by the same reference numeral throughout the drawings, and repetitive descriptions shall be omitted.

FIG. 1 is a configuration diagram of a wire-bonding apparatus 10. The wire-bonding apparatus 10 employs a capillary 28 as a tool for wire bonding and an aluminum wire as a wire 30, and connects two bonding targets with the wire 30 according to a wedge bonding method. In FIG. 1, a chip 6 and a circuit board 8 as the bonding targets are illustrated, although these are not included in the components of the wire-bonding apparatus 10. As used herein according to the embodiment of the present invention, the wedge bonding method refers to a bonding method that performs bonding using ultrasonic waves or a pressure without forming an FAB at a tip of the wire.

The wire-bonding apparatus 10 is configured including a bonding stage 14 held on a mount 12, an XY stage 16, and a computer 60.

The bonding stage 14 is a bonding target supporting stage on which the chip 6 and the circuit board 8 as the two bonding targets are placed. The bonding stage 14 is movable with respect to the mount 12 when the circuit board 8 or the like are placed or discharged, but not movable with respect to the mount 12 during a bonding operation. As the bonding stage 14, a metallic moving table can be used. The bonding stage 14 is connected to a reference potential, such as a ground potential of the wire-bonding apparatus 10. If the bonding stage 14 is required to be insulated from the chip 6 or the circuit board 8, an insulation treatment is applied to a portion of the bonding stage 14 that is required to be insulated.

The chip 6 is an electronic circuit in which a silicon substrate and a transistor and the like are integrated. As an electronic circuit, input terminals, output terminals, and the like are pulled out as a plurality of pads (not depicted) on an upper surface of the chip 6. A lower surface of the chip 6 is a back surface of the silicon substrate, and constituted as a grounding electrode of the electronic circuit.

The circuit board 8 is configured such that a desired wiring is patterned on an epoxy resin substrate, and includes a chip pad (not depicted) that electrically and mechanically connects and fixes the lower surface of the chip 6, a plurality of leads (not depicted) disposed around the chip pad, and the input terminals and the output terminals of the circuit board pulled out from the chip pad and the plurality of leads. Wire bonding is performed by connecting the pads of the chip 6 and the leads of the circuit board 8 with the wire 30.

A lead clamper 50 provided for the bonding stage 14 is a flat-plate member having an opening in its center and supports the circuit board 8. The lead damper 50 fixes the circuit board 8 to the bonding stage 14 by holding the circuit board 8 around a peripheral edge of the opening, while the lead of the circuit board 8 and the chip 6 to be connected by wire bonding are positioned in the opening in the center.

A folding station 51 provided for the lead damper 50 is for shaping the wire 30 projecting from the capillary 28 into a predetermined flexed shape. The predetermined flexed shape refers to a shape that is flexed along each of the connecting directions when the connecting directions of the wire 30 between the plurality of leads of the circuit board 8 and the plurality of pads of the chip 6 are different. The folding station 51 configured with an upper surface 52 of the lead damper 50 used for pressing the tip of the wire 30 projecting from the capillary 28 to flex the wire, and a wire insertion hole 54 used as a guide for flexing of the wire by inserting the tip of the wire 30 projecting from the capillary 28.

The XY stage 16 is a moving table provided with a bonding head 18, and configured to move the bonding head 18 to a desired position in an XY plane with respect to the mount 12 and the bonding stage 14. The XY plane is a plane parallel to an upper surface of the mount 12. A Y direction is parallel to a longitudinal direction of an ultrasonic transducer 24 attached to a bonding arm (not depicted) that will be later described. FIG. 1 shows an X direction and the Y direction, as well as a Z direction that is perpendicular to the XY plane.

The bonding head 18 is fixed to and provided for the XY stage 16. The bonding head 18 is a moving mechanism including a Z motor 20, and configured to move the capillary 28 in the Z direction, by controlling rotation of this motor, through a Z-drive arm 22 and the ultrasonic transducer 24. As the Z motor 20, a linear motor can be used.

To the Z-drive aim 22, the ultrasonic transducer 24 and a wire clamper 32 are attached. The Z-drive arm 22 is a member that is rotatable about a rotation center provided for the bonding head 18 by controlling rotation of the Z motor 20. The rotation center provided for the bonding head 18 is not necessarily an output axis of the Z motor 20, and is set at a position where a rotational load is reduced considering a position of a gravity center as a whole including the Z-drive arm 22, the ultrasonic transducer 24, and the wire clamper 32.

The ultrasonic transducer 24 is an elongated stick-like member configured such that a base portion of the ultrasonic transducer 24 is attached to the Z-drive arm 22, and the capillary 28 through which the wire 30 is inserted is attached to a tip portion of the ultrasonic transducer 24. To the ultrasonic transducer 24, the Ultrasonic vibrator 26 is attached, and the ultrasonic transducer 24 transmits ultrasonic energy produced by driving an Ultrasonic vibrator 26 to the capillary 28. Therefore, the ultrasonic transducer 24 is configured in a horned shape that is tapered to the tip so that ultrasonic energy from the Ultrasonic vibrator 26 can be efficiently transmitted to the capillary 28. As the Ultrasonic vibrator 26, a piezoelectric device can be used.

The capillary 28 is a bonding tool in a conical body with a flat tip surface and having a through hole in its center through which the wire 30 can be inserted along its longitudinal direction. As the capillary 28, a ceramic capillary used in ball bonding can be used as it is. The capillary used in ball bonding has a corner portion in an appropriate shape called chamfer on a side of the tip surface in the through hole so as to be able to easily hold an FAB. In the wedge bonding method according to this embodiment, the capillary for ball bonding is used. The capillary has a flat surface called a face at a lower surface on the side of the tip surface in the through hole of this capillary. The face constitutes a pressing surface when wedge bonding is performed by the wire-bonding apparatus 10.

At a tip portion of a tool for wedge bonding, a wire feed guide inclined with respect to its longitudinal direction and a pressing surface for pressing a side surface of the wire are provided. Therefore, the wire projects laterally in a direction along the direction of the wire feed guide, instead of in a manner rotationally symmetric about an axis along the longitudinal direction of the tool. If such a tool for wedge bonding is used, there is a case in which the direction of the wire feed guide does not match the direction in which the wire is to be bonded depending on positions of the leads and the pads.

For example, if the chip 6 is mounted at a central portion of the circuit board 8, the plurality of pads are arranged along a peripheral end of the chip 6, and the plurality of leads are provided for the circuit board 8 so as to encircle around the chip 6, the connecting direction of the wire between a lead and a pad varies each time when wire bonding is performed a plurality of times. In order to align the direction of the wire feed guide with the connecting direction of the wire, it is necessary either to cause the tool for wedge bonding to be rotate around the axis along the longitudinal direction, or to rotate the circuit board 8.

In contrast, as the face of the capillary 28 on the side of the tip surface is rotationally symmetrical about the axis of the capillary 28 along the longitudinal direction, even if the connecting direction of the wire between a lead and a pad varies each time of wire bonding, it is sufficient to perform a shaping operation for slightly changing the direction of the wire 30 projecting from the tip of the capillary 28. Accordingly, the capillary 28 is used in wedge bonding.

The wire 30 inserted through the capillary 28 is an aluminum fine wire. The wire 30 is wound around a wire spool 33 provided at a tip of a wire holder extending from the bonding head 18, and inserted into the through hole in the center of the capillary 28 from the wire spool 33 via the wire clamper 32. The wire 30 then projects from the tip of the capillary 28. Examples of a material of the wire 30 include a fine wire in which silicon, magnesium, and such are appropriately mixed, in addition to a pure aluminum fine wire. A diameter of the wire 30 can be selected depending on the bonding target. One example of the diameter of the wire 30 is 30 μm.

The wire damper 32 is a wire clamping device attached to the Z-drive arm 22, and having a pair of clamping plates respectively disposed on the both sides of the wire 30. The wire damper 32 is configured to cause the wire 30 to be in a freely movable state by opening the facing clamping plates, and cause the wire 30 to be not movable by closing the facing clamping plates. As being attached to the Z-drive arm 22, the wire damper 32 is able to appropriately clamp the wire 30 even when the capillary 28 moves in any direction in X, Y, or Z. Opening/closing of the wire damper 32 is performed by activating a damper opening/closing unit 34 employing a piezoelectric device.

The computer 60 controls operations of the components of the wire-bonding apparatus 10 as a whole. The computer 60 includes a controller 80 as a CPU, various interface circuits, and a memory 82. These components are connected with each other via an internal bus.

The various interface circuits are drive circuits or buffer circuits provided between the controller 80 as a CPU and the respective components of the wire-bonding apparatus 10. In FIG. 1, the interface circuits are simply referred to as I/Fs. The various interface circuits include an XY stage I/F 62 connected to the XY stage 16, a Z motor IN 64 connected to the Z motor 20, an Ultrasonic vibrator I/F 66 connected to the Ultrasonic vibrator 26, and a damper opening/closing I/F 68 connected to the damper opening/closing unit 34.

The memory 82 is a storage device that stores various programs and various control data. The various programs include a first bonding program 84 relating to the first wire bonding, a second bonding program 86 relating to the second wire bonding, a disconnecting operation program 88 for disconnecting the wire 30 by moving the capillary 28, a preliminary bonding program 90 relating to preliminary bonding performed for shaping the tip of the wire 30, a shaping operation program 92 relating to the operation of shaping the tip of the wire 30, and a control program 94 relating to other control operations. Examples of control data 96 include data relating to a connecting direction in wire bonding.

Figure 2:
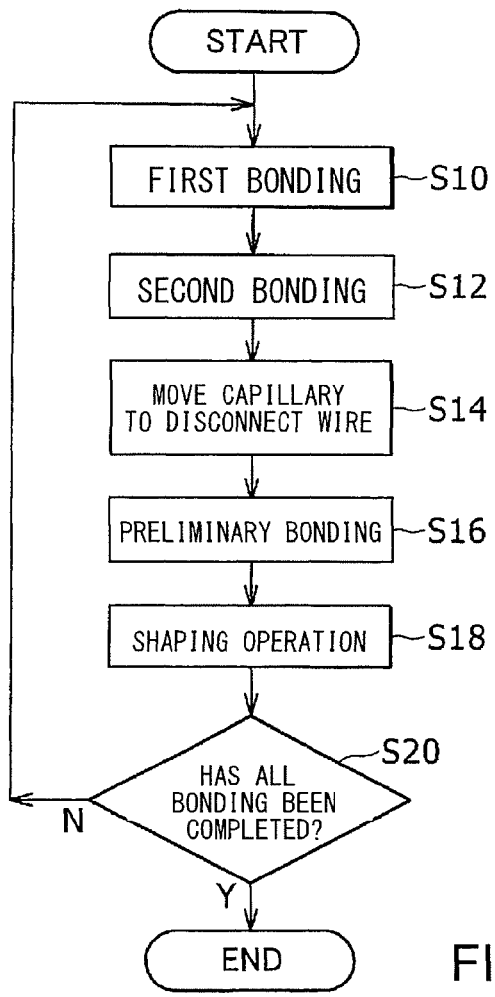
FIG. 2 is a flowchart showing steps of a method of manufacturing a semiconductor device according to an embodiment of the present invention.

Effects of the above configuration, in particular, functions of the computer 60 will be described in further detail with reference to FIG. 2 and the following Figures. FIG. 2 is a flowchart showing steps of a method of manufacturing a semiconductor device. FIG. 3 through FIG. 16 are views illustrating the operations in the flowchart shown in FIG. 2. FIG. 17 through FIG. 20 are views illustrating another shaping operation. FIG. 21 is a diagram illustrating that a bonding strength varies depending on how the wire 30 is disconnected at the second bonding point.

FIG. 2 is the flowchart showing the steps of the method of manufacturing a semiconductor device, and the steps correspond respectively to operational steps of the programs stored in the memory 82 of the computer 60.

Figure 3:
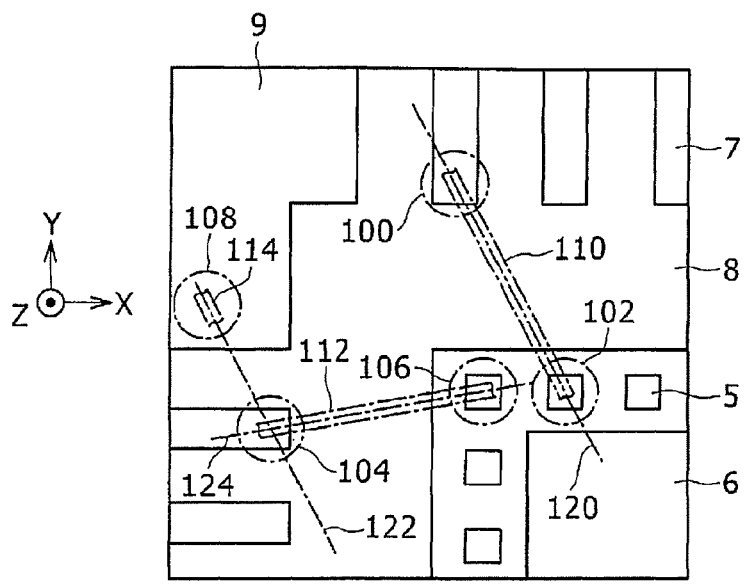
FIG. 3 is a diagram illustrating an example in which wire bonding is performed twice in different connecting directions of a wire between a plurality of leads of a circuit board and a plurality of pads of a chip in the method of manufacturing a semiconductor device according to the embodiment of the present invention.

Hereinafter, the steps in the flowchart in FIG. 2 will be described, taking an example in which wire bonding is performed twice in different connecting directions of the wire 30 between the plurality of leads 7 of the circuit board 8 and the plurality of pads 5 of the chip 6. FIG. 3 is a partial view of the bonding stage 14 viewing from a side of the capillary 28 to a −Z direction, illustrating the example in which wire bonding is performed twice. In the Figure, five leads 7 of the circuit board 8, a lead 9 used for preliminary bonding, and five pads 5 of the chip 6 are shown.

Here, the wire bonding to be first performed is to connect the first bonding point 100 provided for one of the leads 7 of the circuit board 8 and the second bonding point 102 provided for one of the pads 5 of the chip 6 with a wire 110. The wire bonding to be second performed is to connect a first bonding point 104 provided for one of the leads 7 of the circuit board 8 and a second bonding point 106 provided for one of the pads 5 of the chip 6 with a wire 112. A connecting direction 120 of the wire 110 and a connecting direction 124 of the wire 112 make an angle of 70 degrees with each other.

A preliminary bonding point 108 provided for the lead 9 is at a position for preliminary bonding to allow smooth transition from the wire bonding performed first to the wire bonding performed next even when the connecting direction 120 is different from the connecting direction 124. Preliminary bonding is performed after the wire bonding performed first at the second bonding point 102 is completed and before the wire bonding performed next at the first bonding point 104 is started. The preliminary bonding will be described later in further detail.

Returning back to FIG. 2, when the wire-bonding apparatus 10 is turned on, the components of the wire-bonding apparatus 10 including the computer 60 are initialized.

Next, the bonding stage 14 is pulled out once, and the circuit board 8 having the chip 6 mounted thereon as a bonding target positioned and placed on the bonding stage 14 and then pressed and fixed with the lead clamper 50. Then, the bonding stage 14 is moved back to an initial position. It should be noted that the bonding stage 14 can be heated up to a predetermined temperature determined based on the bonding conditions if necessary. The bonding target setting step is automatically performed using of an automated carrier device of the circuit board 8.

Thereafter, the first bonding program 84 is executed by the controller 80, and the first wire bonding is performed at the first bonding point 100 (S10). In the first wire bonding, first, the wire 30 is inserted through the capillary 28 in a state in which the wire clamper 32 is open, and the wire 30 projects at the tip of the capillary 28. Then, in response to a command from the controller 80 via the XY stage I/F 62 and the Z motor I/F 64, the XY stage 16 and the Z motor 20 are driven to move, and the capillary 28 with the wire 30 projecting at its tip is moved toward the first bonding point 100. The first bonding point 100 is set on one of the leads 7 of the circuit board 8. The first bonding point 100 is set using a positioning camera or the like that is not illustrated in FIG. 1.

Figure 4:
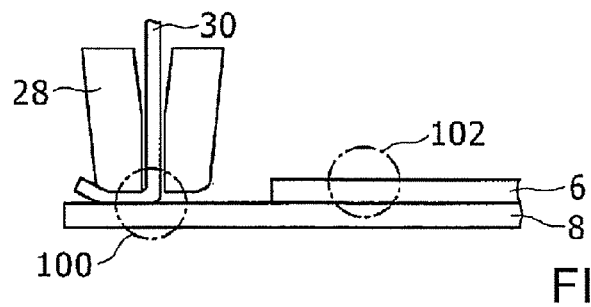
FIG. 4 is a diagram illustrating a first wire bonding step in FIG. 2.

At the first bonding point 100, the wire 30 is sandwiched and pressed between a portion of the tip of the capillary 28 and the lead 7 of the circuit board 8, and the Ultrasonic vibrator 26 is actuated in response to a command from the controller 80 via the Ultrasonic vibrator I/F 66 to bond the wire 30 to the lead 7 by the ultrasonic vibration energy by the transducer unit and a pressing force of the capillary 28 by the Z motor 20 being controlled to drive, as well as a heating temperature from the bonding stage 14 if necessary. FIG. 4 is a diagram illustrating the first wire bonding being performed at the first bonding point 100. In this manner, the first wire bonding at the first bonding point 100 is performed.

After the first wire bonding is completed, the loop forming operation is performed. Specifically, after the first wire bonding is completed, the capillary 28 is moved upward while the wire damper 32 is open, and then moved immediately above the second bonding point 102. The second bonding point 102 is set on one of the pads 5 of the chip 6. During the movement of the capillary 28, the wire 30 is fed from the wire spool 33 and extends from the tip of the capillary 28 by a required length. The movement of the capillary 28 is performed by the XY stage 16 and the Z motor 20 being driven to move in response to a command from the controller 80.

After the loop forming operation, the second wire bonding is performed (S12). This step is performed by the controller 80 executing the second bonding program 86. By including the loop formation step in the second bonding program 86, the second wire bonding can include the loop forming operation.

Figure 5:
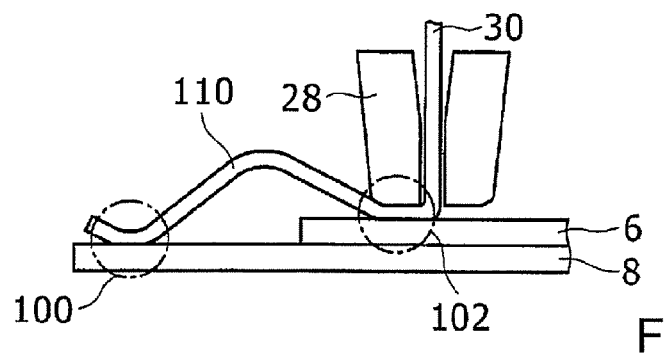
FIG. 5 is a diagram illustrating a second wire bonding step in FIG. 2.

At the second bonding point 102, similarly to the first wire bonding, the wire 30 is sandwiched and pressed between the portion of the tip of the capillary 28 and the pad 5 of the chip 6, and the Ultrasonic vibrator 26 is actuated in response to a command from the controller 80 via the Ultrasonic vibrator I/F 66 to bond the wire 30 to the pad 5 by the ultrasonic vibration energy by the transducer unit and a pressing force of the capillary 28 by the Z motor 20 being controlled to drive, as well as a heating temperature from the bonding stage 14 if necessary. FIG. 5 is a diagram illustrating the wire 110 is fed while forming a loop and the second wire bonding is performed at the second bonding point 102 after the first wire bonding is performed at the first bonding point 100. A direction to which the wire 110 is fed is the connecting direction 120 in the wire bonding performed first as shown in FIG. 3. In this manner, the second wire bonding at the second bonding point 102 is performed.

Referring back to FIG. 2 again, after the second wire bonding is completed, the moving operation for disconnecting the wire is performed (S14). This step is performed by the controller 80 executing the disconnecting operation program 88. The moving operation for disconnecting the wire disconnection is performed in the following steps.

Figure 6:
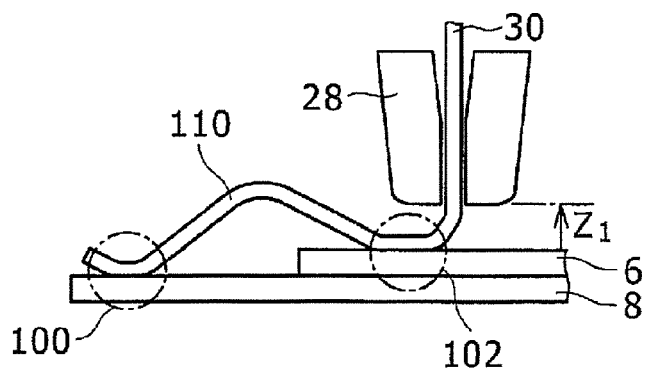
FIG. 6 is a diagram illustrating an operation of slightly moving the capillary upward to disconnect the wire at a second bonding point in FIG. 2.

After bonding at the second bonding point 102 is performed, the Z motor 20 is controlled to rotate in response to a command from the controller 80 via the Z motor I/F 64 to slightly move the capillary 28 upward. FIG. 6 is a diagram illustrating that a position of the capillary 28 increases up to +Z1 from an upper surface of the chip 6.

Next, a command from the controller 80 is supplied to the damper opening/closing unit 34 via the damper opening/closing I/F 68 to close the wire damper 32, and the XY stage 16 is driven to move in this state via the XY stage I/F 62. Thus, the capillary 28 is moved within the XY plane.

In other words, the wire 30 is pulled within the XY plane while the wire damper 32 clamps the wire 30. As conditions for the second wire bonding are set so that bonding strength at the second bonding point 102 is sufficiently greater than bond shear strength of the wire 30, the wire 30 is disconnected at the second bonding point 102.

In this manner, by the operation of moving the capillary 28, the wire 30 is pulled from the second bonding point 102 and disconnected.

Figure 7:
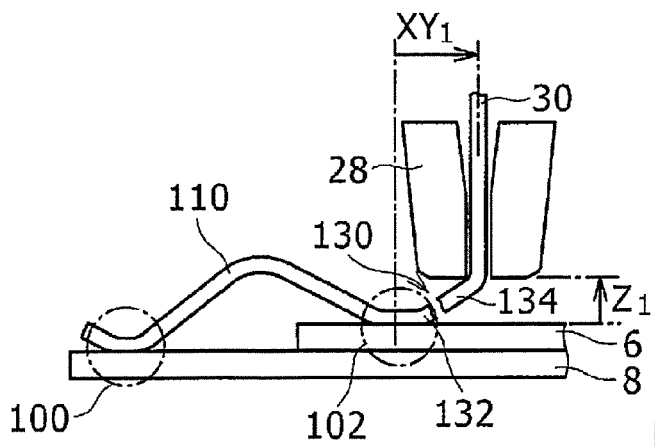
FIG. 7 is a diagram illustrating an operation of disconnecting the wire by moving the capillary within an XY plane at the second bonding point after the state shown in FIG. 6.

FIG. 7 is a diagram illustrating that the capillary 28 is moved by a distance indicated by XY1 within the XY plane from the state shown in FIG. 6, and the wire 30 is in a disconnected state 130 at the second bonding point 102. The distance of movement indicated by XY1 is a distance along the connecting direction 120 shown in FIG. 3. In other words, the wire 30 is pulled from the second bonding point 102 along the connecting direction 120 in which the wire 110 in a loop extends and disconnected. FIG. 7 shows a tip portion 132 of a disconnected side left on a side of the second bonding point 102, and a disconnected wire tail 134 of the wire 30 projecting from the tip of the capillary 28.

Referring back to FIG. 2 again, after the operation of moving the capillary 28 to disconnect the wire is completed, the preliminary bonding is performed (S16). This step is performed by the controller 80 executing the preliminary bonding program 90. The preliminary bonding is performed in the following manner by moving the capillary 28 via the XY stage I/F 62 and the Z motor I/F 64, opening/closing the wire clamper 32 via the clamper opening/closing I/F 68, and actuating the Ultrasonic vibrator 26 via the Ultrasonic vibrator I/F 66.

Figure 8:
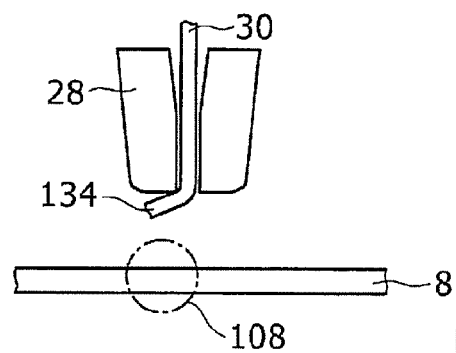
FIG. 8 is a diagram illustrating an operation of moving the capillary to a preliminary bonding point while the wire whose tip is disconnected is held with the capillary after the state shown in FIG. 7.

The capillary 28 is moved immediately above the preliminary bonding point 108 provided for the lead 9 for preliminary bonding while the wire 30 having the wire tail 134 projecting from the tip of the capillary 28 is held. FIG. 8 is a diagram illustrating that the capillary 28 is moved immediately above the preliminary bonding point 108 of the circuit board 8.

Figure 9:
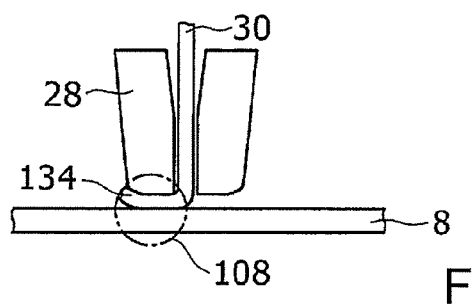
FIG. 9 is a diagram illustrating that the wire is bonded to a circuit board at the preliminary bonding point in preliminary bonding after the state shown in FIG. 8.

Next, the capillary 28 is moved down to the −Z direction while the wire tail 134 is held at the tip to perform wire bonding at the preliminary bonding point 108. Specifically, the Ultrasonic vibrator 26 is actuated in response to a command from the controller 80 via the Ultrasonic vibrator I/F 66 to bond the wire tail 134 to the lead 9 of the circuit board 8 by the ultrasonic vibration energy by the transducer unit and the pressing force of the capillary 28 by the Z motor 20 being controlled to drive, as well as by a heating temperature from the bonding stage 14 if necessary. FIG. 9 is a diagram illustrating that the wire tail 134 is bonded to the circuit board 8 at the preliminary bonding point 108.

After the wire tail 134 and the circuit board 8 bonded at the preliminary bonding point 108, then the capillary 28 is moved immediately upward to the +Z direction from the preliminary bonding point 108 while the wire clamper 32 is closed as an operation of a wire tail movement and a wire cutting movement. As conditions for the preliminary bonding are set such that bonding strength at the preliminary bonding point 108 is sufficiently greater than the bond shear strength of the wire 30, the wire 30 is disconnected at the preliminary bonding point 108. In this manner, the wire 30 is pulled from the preliminary bonding point 108 by moving the capillary 28, and thus the wire 30 is disconnected.

Figure 10:
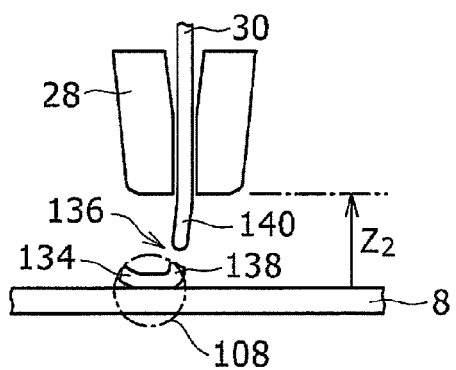
FIG. 10 is a diagram illustrating an operation of disconnecting the wire by moving the capillary in a vertical direction from the preliminary bonding point after the state shown in FIG. 9.

FIG. 10 is a diagram illustrating that the capillary 28 is moved by a distance indicated by Z2 to +Z direction from the state shown in FIG. 9, and the wire 30 is in a disconnected state 136 at the preliminary bonding point 108. FIG. 10 shows a portion 134 left on a side of the preliminary bonding point 108, and a wire tail 140 projecting from the tip of the capillary 28.

When the tip of the wire 30 is disconnected at the preliminary bonding point substantially straight along the axial direction of the capillary 28, referring back to FIG. 2, the operation of shaping the wire tail 140 is performed (S18). This step is performed by the controller 80 executing the shaping operation program 92. The shaping operation is performed in the following manner, by moving the capillary 28 via the XY stage I/F 62 and the Z motor I/F 64, and opening/closing the wire clamper 32 via the damper opening/closing I/F 68.

Figure 11:
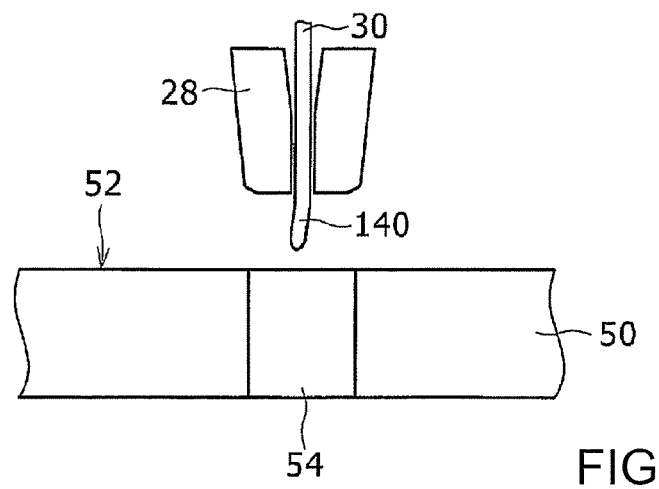
FIG. 11 is a diagram illustrating an operation of moving the wire projecting straight from a tip of the capillary immediately above a wire insertion hole of a folding station after the state shown in FIG. 10.

The capillary 28 is moved immediately above the wire insertion hole 54 of the folding station 51 while holding the wire 30 having the wire tail 140 projecting from the capillary 28. FIG. 11 is a diagram illustrating that the capillary 28 is moved immediately above the wire insertion hole 54 of the folding station 51.

Figure 12:
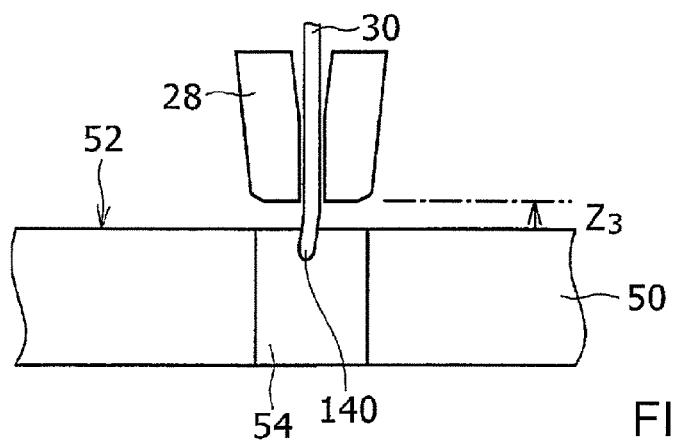
FIG. 12 is a diagram illustrating an operation of inserting the wire projecting straight from the tip of the capillary to the wire insertion hole of the folding station after the state shown in FIG. 11.
Figure 13:
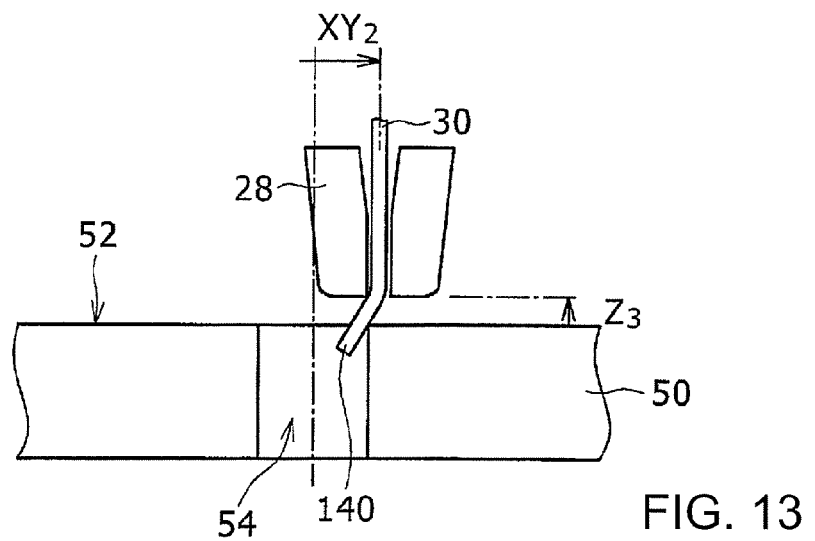
FIG. 13 is a diagram illustrating an operation of flexing the wire projecting straight from the tip of the capillary by moving the capillary within the XY plane after the state shown in FIG. 12.

Then, the capillary 28 is moved downward to cause the wire tail 140 to be inserted through the wire insertion hole 54. FIG. 12 is a diagram illustrating that the wire tail 140 is inserted into the wire insertion hole 54 while the tip of the capillary 28 maintains a predetermined distance Z α from the upper surface 52 of the folding station 51. Next, the capillary 28 is slightly moved upward to the +Z direction, and moved toward a predetermined direction within the XY plane. FIG. 13 shows that the capillary 28 is moved upward by Z3, and while maintaining this height, moved by a distance indicated by XY2 within the XY plane. Z3 is set to a height such that the wire tail 140 is flexed and comes between the upper surface 52 of the folding station 51 and the tip of the capillary 28. The direction of movement by XY2 within the XY plane is set to a direction parallel to the connecting direction 124 of the wire bonding performed next.

Figure 14:
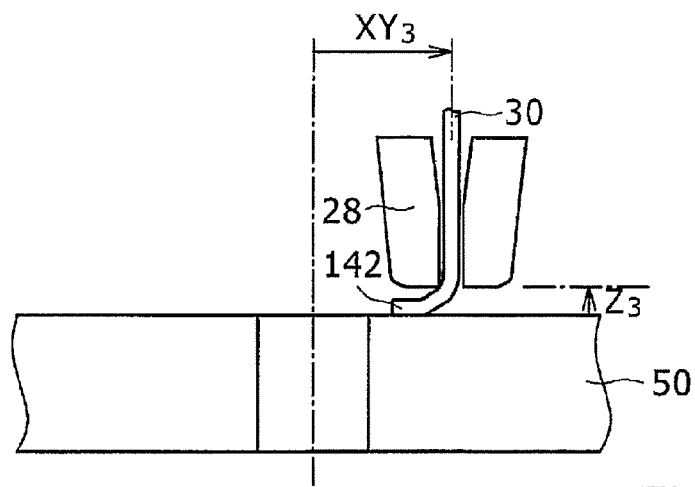
FIG. 14 is a diagram illustrating an operation of shaping the wire projecting straight from the tip of the capillary in a predetermined flexed shape by continuing the movement of the capillary within the XY plane in FIG. 13.

By setting Z3 and XY2 in this manner, the wire tail 140 is, while partially guided into the wire insertion hole 54, flexed substantially at right angle to the axial direction of the capillary 28 in a direction parallel to the desired connecting direction 124. By further moving the capillary 28 within the XY plane, the wire tail 140 gradually comes out of the wire insertion hole 54, and finally an entirety of the wire tail 140 is flexed at substantially at right angle to the axial direction of the capillary 28 in a direction parallel to the desired e connecting direction 124, and thus the shaping is completed. FIG. 14 is a diagram illustrating that the capillary 28 is moved within the XY plane by a distance indicated by XY3 to form a wire tail 142 an entirety of which is shaped in a desired shape.

Figure 15:
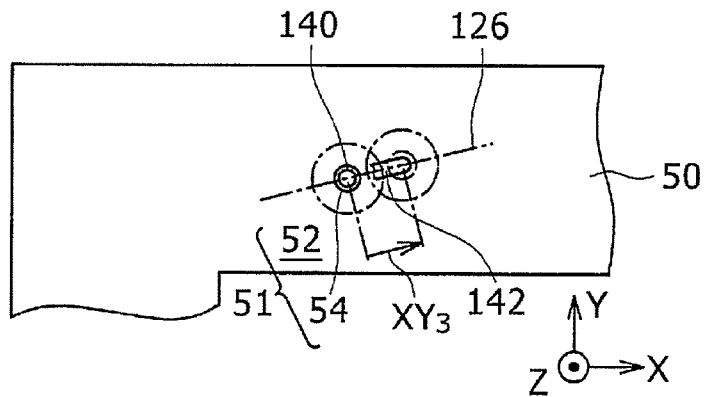
FIG. 15 is a diagram illustrating the folding station on which the operations from FIG. 11 to FIG. 14 are performed.

FIG. 15 is a diagram showing the shaping of the wire tail 140 on the folding station 51 of the lead clamper 50. The Figure shows that the wire tail 140 is inserted into the wire insertion hole 54 of the folding station 51, and the capillary 28 moves within the XY plane along a flexing direction 126 by a distance of XY3. The flexing direction 126 is a direction parallel to the connecting direction 124 of the wire bonding performed next.

Figure 16:
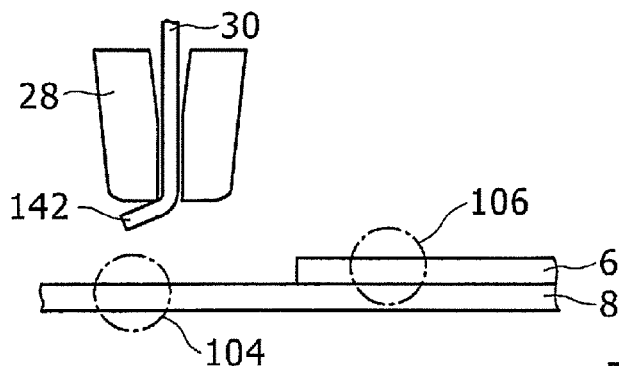
FIG. 16 is a diagram illustrating an operation of moving the capillary holding the wire whose tip has been shaped in the predetermined flexed shape to a first bonding point in subsequent wire bonding after the state shown in FIG. 14.

After the wire tail 142 thus formed is flexed in a direction parallel to the desired connecting direction 124 and shaped, the capillary 28 is moved immediately above the first bonding point 104 of the wire bonding performed next. FIG. 16 illustrates the first bonding point 104 and the second bonding point 106 of the wire bonding performed next, showing that the capillary 28 holding the wire 30 is moved immediately above the first bonding point 104. Thereafter, similarly to the state described with reference to FIG. 4, the first wire bonding is performed. Then, similarly to the state described with reference to FIG. 5, the wire 30 is fed along the connecting direction 124, and the second wire bonding is performed at the second bonding point. Then, the steps described with reference to FIG. 6 and the following Figures are repeated, and the wire bonding performed next is performed.

Referring back to FIG. 2, when there are the plurality of leads 7 of the circuit board 8 and the plurality of pads 5 of the chip 6, it is determined whether or not all the wire bonding is completed (S20). If there is still wire bonding to be performed, the process returns to S10 and the above steps are repeated. When all the wire bonding is completed, the circuit board 8 having the chip 6 to which wire bonding has been performed is carried outside. If necessary, the circuit board 8 having the chip 6 to which wire bonding is to be next performed is carried in, and wire bonding to this chip is performed.

In the above description, the shaping operation in S18 is performed on the folding station 51. Instead, the shaping operation can be performed on the lead 9 where the preliminary bonding is performed. FIG. 17 through FIG. 20 are diagrams showing steps of shaping the wire tail on the lead 9 where the preliminary bonding is performed into a desired folded shape for the first bonding point 104 of the wire bonding performed next.

Figure 17:
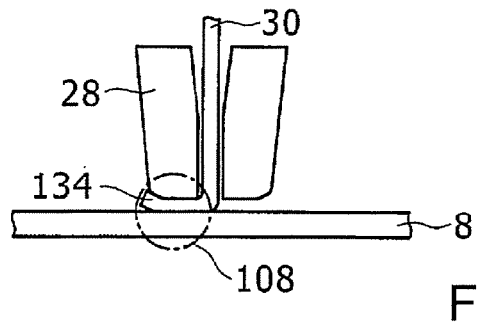
FIG. 17 is a diagram illustrating an operation of moving the capillary holding the wire whose tip has been disconnected in FIG. 7 to the preliminary bonding point for another shaping operation.
Figure 18:
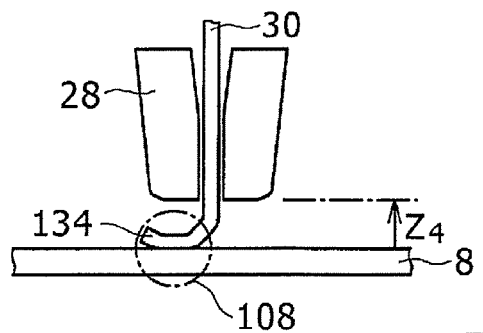
FIG. 18 is a diagram illustrating an operation of moving the capillary slightly upward to disconnect the wire at the preliminary bonding point after the state shown in FIG. 17.

FIG. 17 is the diagram illustrating that the preliminary bonding is performed at the preliminary bonding point 108. FIG. 17 shows the same state that as shown in FIG. 9, and detailed description shall be omitted. Next, at the preliminary bonding point 108, an operation of moving the capillary 28 slightly upward to the +Z direction is performed. FIG. 18 shows that the capillary 28 is moved so that the tip of the capillary 28 comes to Z4 from an upper surface of the circuit board 8. Z4 can take the same value as Z1 shown in FIG. 6.

Next, the wire damper 32 is closed, and an operation of moving the capillary 28 within the XY plane is performed. This operation corresponds to the operation shown in FIG. 7, and the wire 30 is pulled from the preliminary bonding point 108 by this operation, and thus the wire 30 is disconnected.

Figure 19:
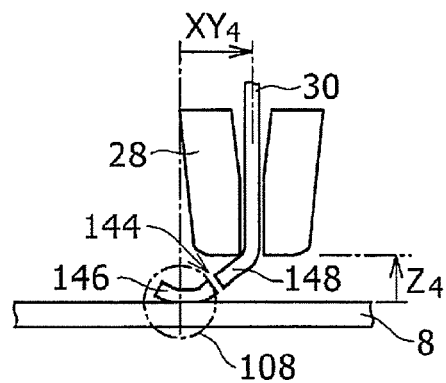
FIG. 19 is a diagram illustrating an operation of disconnecting the wire at the preliminary bonding point by moving the capillary within the XY plane after the state shown in FIG. 18.

FIG. 19 is the diagram illustrating that the capillary 28 is moved by a distance indicated by XY4 within the XY plane from the state shown in FIG. 18, and the wire 30 is in a disconnected state 144 at the preliminary bonding point 108. FIG. 19 shows a portion 146 left on a side of the preliminary bonding point 108, and a wire tail 148 projecting from the tip of the capillary 28.

The distance of movement indicated by XY4 is a distance along a direction parallel to the connecting direction 124 of the wire bonding performed next. In other words, the direction in which the wire 30 is pulled at the preliminary bonding point 108 changes to the direction parallel to the connecting direction 124. With this, a direction in which the wire tail 148 projecting from the tip of the capillary 28 extends becomes the direction parallel to the desired connecting direction 124 at the first bonding point 104.

Figure 20:
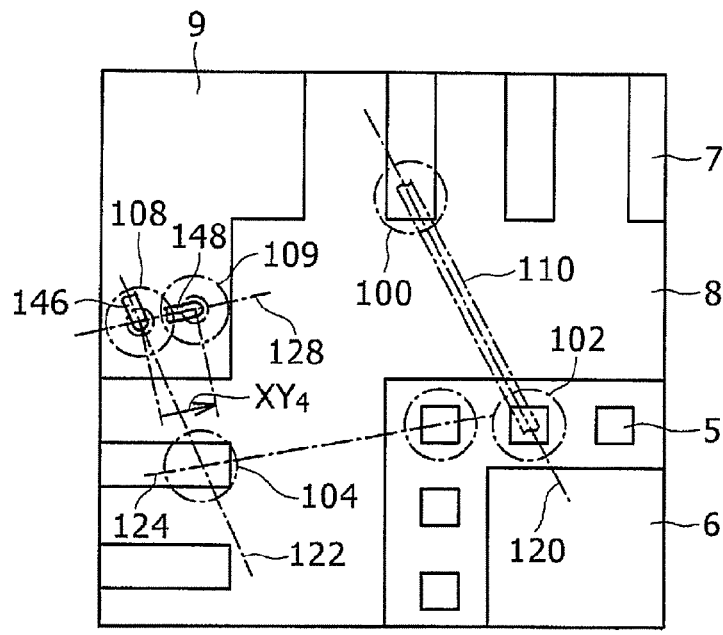
FIG. 20 is a diagram corresponding to FIG. 3 when another shaping operation is performed at the preliminary bonding point.
Figure 21:
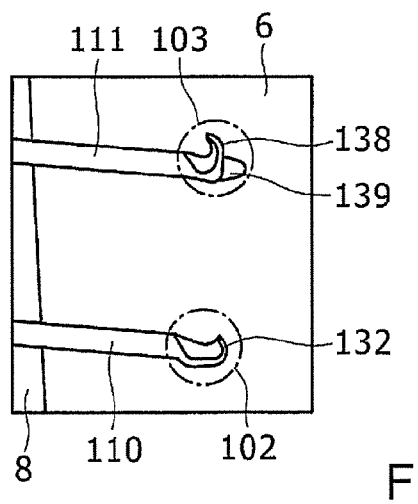
FIG. 21 is a diagram illustrating a case in which the wire is disconnected at the second bonding point by moving the capillary vertically upward, and a case in which the wire is disconnected at the second bonding point by moving the capillary within the XY plane in comparison.

FIG. 20 is a diagram corresponding to FIG. 3, illustrating preliminary bonding on the lead 9 and subsequent disconnection of the wire 30. The Figure shows a shaped disconnecting point 109 to which the capillary 28 is moved along a flexing direction 128 parallel to the connecting direction 124 from the preliminary bonding point 108 by XY4. A flexing direction 122 of the wire 30 when the preliminary bonding is performed at the preliminary bonding point 108 is parallel to the connecting direction 120 of the wire bonding performed first, but the flexing direction 128 of the wire tail 148 disconnected at the shaped disconnecting point 109 is parallel to the connecting direction 124 of the wire bonding performed next.

As described above, it is possible to perform the desired shaping operation without using the folding station 51, by moving the capillary 28 within the XY plane after the preliminary bonding in the direction parallel to the connecting direction 124 of the wire bonding performed next and disconnecting the wire 30. In this manner, the desired shaping operation is an operation of making a folded shape of the wire tail projecting from the tip of the capillary 28 parallel to the connecting direction of wire bonding.

Next, effects of the above configuration will be described with reference to FIG. 21. FIG. 21 is the diagram illustrating that a bonding strength varies depending on how the wire is disconnected at the second bonding point. In FIG. 21, the second wire bonding is pedal led to the pad 5 of the chip 6 using two wires 110 and 111.

For the wire 110, on one side, there is shown the tip portion 132 of the disconnected side left on the side of the second bonding point 102 when the wire 30 is disconnected at the second bonding point 102 by moving the capillary 28 within the XY plane while the wire damper 32 is closed after moving the capillary 28 slightly upward from the second bonding point 102. This disconnection method is the same as what is described with reference to FIG. 7. Describing taking the case in FIG. 7, the movement direction of the capillary 28 within the XY plane is the connecting direction 120 from the first bonding point 100 to the second bonding point 102 in the corresponding wire bonding.

For the wire 111, there is shown a tip portion 138 of a disconnected side left on a side of a second bonding point 103 when the wire 30 is disconnected at the second bonding point 103 by moving the capillary 28 vertically upward from a second bonding point 103 while the wire damper 32 is closed. This disconnection method is the same as that described with reference to FIG. 10. FIG. 10 shows the tip portion 138 of the disconnected side left on the side of the preliminary bonding point 108. The tip portion 138 includes a curled-up portion 139 partially curled up from a bonded portion of the chip 6 produced by pulling the wire 30 upward from the bonded portion. Due to the production of the partially curled-up portion 139, a bonding strength of the other wire 111 at the second bonding point 103 is reduced as compared to a bonding strength of the one wire 110 at the second bonding point 102.

As illustrated in FIG. 21, in order to ensure the bonding strength at the second bonding point, it is desirable that the wire 30 is disconnected by moving the capillary 28 slightly upward at the second bonding point and then within the XY plane. However, when the wire 30 is disconnected in this manner, the folded shape of the wire tail left at the tip of the capillary 28 becomes parallel to a direction along which the wire is pulled within the XY plane.

When the connecting direction of the wire bonding to be next performed is different from the connecting direction in the previous wire bonding, if the wire is moved to the first bonding point of subsequent wire bonding with this wire tail, the direction to which the wire tail projecting from the capillary 28 extends becomes different from the connecting direction of the subsequent wire bonding. Performing the first wire bonding at the first bonding point in this state and then the capillary 28 is moved along the connecting direction of the wire 30, the wire 30 becomes twisted at the bonded portion at the first bonding point. In this manner, when the wire tail projecting from the tip of the capillary 28 at the first bonding point is folded toward a direction different from the connecting direction of the wire bonding, the bonding strength at the first bonding point decreases.

Therefore, in the above configuration, as described with reference to FIG. 7, in the disconnection of the wire at the second bonding point in the wire bonding performed first, the wire 30 is disconnected by moving the capillary 28 slightly upward at the second bonding point 102 and then within the XY plane. With this, it is possible to ensure the bonding strength at the second bonding point 102.

Then, the preliminary bonding is performed (S16) in order to ensure the bonding strength at the first bonding point, and the capillary 28 is moved vertically upward from the second bonding point 103 while the wire clamper 32 is closed, and to thereby disconnect the wire 30 at the second bonding point 103. Then, the desired shaping operation is performed (S18). As described above, the desired shaping operation is an operation of making a folded shape of the wire tail projecting from the tip of the capillary 28 parallel to the connecting direction of wire bonding. The desired shaping operation can be performed using the folding station 51 in the steps described with reference to FIG. 11 through FIG. 14, or can be performed on the lead 9 where the preliminary bonding is performed in the steps described with reference to FIG. 17 through FIG. 20. With this, it is possible to ensure the bonding strength at the first bonding point.

The present invention is not limited to the embodiment described above, and includes any modifications and alterations without departing from the technical scope and the spirit of the present invention defined by the appended claims.

INDUSTRIAL APPLICABILITY

The present invention can be applied to an apparatus and a wire bonding method, both for performing wire bonding using a capillary.

What is claimed is:
1. A method of manufacturing a semiconductor device, the method comprising:
providing a wire bonding apparatus comprises:
a capillary through which an aluminum wire is inserted;
a clamper configured to hold the aluminum wire in a clamped state with respect to the capillary; and
a folding station used for shaping the aluminum wire projecting from a tip of the capillary into a predetermined folded shape;
a first bonding step of bonding the aluminum wire to a first bonding target at a first bonding point in wire bonding according to a wedge bonding method using the capillary;
a second bonding step, after the first bonding step, of feeding the aluminum wire from the first bonding point by a predetermined loop length, and bonding the aluminum wire to a second bonding target at a second bonding point in the wire bonding;
a disconnecting step, after the second bonding step, of moving the capillary along a horizontal plane perpendicular to an axial direction of the capillary while the aluminum wire is held in the clamped state, and thereby disconnecting the aluminum wire from the second bonding point;
a preliminary bonding step, after the disconnecting step, of feeding the aluminum wire from the second bonding point to a predetermined preliminary bonding point, performing preliminary bonding at the preliminary bonding point, then moving the capillary in a direction parallel to the axial direction of the capillary while the aluminum wire is held in the clamped state, and thereby disconnecting the aluminum wire from the preliminary bonding point; and
a shaping step, after the preliminary bonding step, of moving the capillary in a state in which the aluminum wire is projected from the tip of the capillary to a previously determined position of the folding station, pressing the tip of the capillary against an upper surface of the folding station, and thereby shaping the aluminum wire projecting from the tip of the capillary into a predetermined flexed shape, wherein a location of the previously determined position of the folding station is different from the predetermined preliminary bonding point.

2. A method of manufacturing a semiconductor device by using a wire bonding apparatus, wherein the wire bonding apparatus comprises a capillary through which an aluminum wire is inserted and a clamper configured to hold the aluminum wire in a clamped state with respect to the capillary, the method comprising sequential ordered steps of:

a first bonding step of bonding the aluminum wire to a first bonding target at a first bonding point in wire bonding according to a wedge bonding method using the capillary;

a second bonding step, after the first bonding step, of feeding the aluminum wire from the first bonding point by a predetermined loop length, and bonding the aluminum wire to a second bonding target at a second bonding point in the wire bonding;

a disconnecting step, after the second bonding step, of moving the capillary along a horizontal plane perpendicular to an axial direction of the capillary while the aluminum wire is held in the clamped state, and thereby disconnecting the aluminum wire from the second bonding point;

a preliminary bonding step, after the disconnecting step, of feeding the aluminum wire from the second bonding point to a predetermined preliminary bonding point, and performing preliminary bonding of the aluminum wire projecting from a tip of the capillary at the preliminary bonding point, wherein a bump is not created during the preliminary bonding step; and a shaping step, after the preliminary bonding step, of first moving the capillary while the aluminum wire is held in the clamped state by a predetermined distance in a same direction as that of the axial direction of the capillary, then secondly moving the capillary while the aluminum wire is held in the clamped state by a predetermined distance to a predetermined direction along the horizontal plane subsequently, disconnecting the aluminum wire from the preliminary bonding point, and thereby shaping the aluminum wire projecting from a tip of the capillary into a predetermined flexed shape, wherein the predetermined preliminary bonding point is placed in a position that does not connect to the first bonding target and the second bonding target.

3. The method according to claim 2, further comprising:

a third bonding step of bonding the aluminum wire to the first bonding target at a third bonding point different from the first bonding point;

a fourth bonding step of bonding the aluminum wire to the second bonding target at a fourth bonding point different from the second bonding point; and an additional disconnecting step, after the fourth bonding step, to disconnect the aluminum wire from the fourth bonding point; and an additional preliminary bonding step, after the disconnecting step, wherein in the additional preliminary bonding step, the capillary is moved in the predetermined direction parallel to a straight line connecting between the third bonding point and the fourth bonding point.

4. The method according to claim 2, wherein the predetermined direction is parallel to a straight line.

* * * * *